United States Patent
Hoang et al.

(10) Patent No.: US 7,276,936 B1
(45) Date of Patent: Oct. 2, 2007

(54) CLOCK CIRCUITRY FOR PROGRAMMABLE LOGIC DEVICES

(75) Inventors: Tim Tri Hoang, San Jose, CA (US); Sergey Yuryevich Shumarayev, San Leandro, CA (US); In Whan Kim, Newark, CA (US); Thungoc Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 96 days.

(21) Appl. No.: 11/239,702

(22) Filed: Sep. 29, 2005

Related U.S. Application Data

(60) Provisional application No. 60/700,893, filed on Jul. 19, 2005.

(51) Int. Cl.
*H03K 19/00* (2006.01)

(52) U.S. Cl. ............................. 326/41; 326/38; 326/93

(58) Field of Classification Search ............ 326/37–41, 326/93
See application file for complete search history.

(56) References Cited

U.S. PATENT DOCUMENTS

| | | | |
|---|---|---|---|
| 6,463,547 B1 * | 10/2002 | Bailey et al. ................ | 713/500 |
| 6,867,616 B1 * | 3/2005 | Venkata et al. ................ | 326/41 |
| 7,075,365 B1 * | 7/2006 | Starr et al. .................. | 327/565 |
| 2001/0033188 A1 * | 10/2001 | Aung et al. .................. | 327/141 |
| 2004/0161070 A1 * | 8/2004 | Yin et al. .................... | 375/371 |

\* cited by examiner

*Primary Examiner*—Don Le
(74) *Attorney, Agent, or Firm*—Fish & Neave IP Group of Ropes & Gray LLP; Robert R. Jackson

(57) ABSTRACT

A programmable logic device includes high-speed serial interface ("HSSI") circuitry that employs one or more clock signals. In addition to use of these clock signals in the HSSI circuitry, circuitry is provided for allowing at least one of these signals to be distributed throughout the PLD core circuitry, e.g., for use as an additional clock signal in the PLD core. Clock distribution is preferably done in a low-skew way.

17 Claims, 5 Drawing Sheets

US 7,276,936 B1

CLOCK CIRCUITRY FOR PROGRAMMABLE LOGIC DEVICES

This application claims the benefit of provisional patent application No. 60/700,893, filed Jul. 19, 2005, which is hereby incorporated by reference herein in its entirety.

BACKGROUND OF THE INVENTION

This invention relates to programmable logic device ("PLD") integrated circuits, and more particularly to clock circuitry for use on PLDs.

PLDs typically have clock signal input pins that are located so as to facilitate distribution of clock signals from those pins throughout the PLD in a relatively low-skew way. (Skew is different amounts of delay in a signal reaching different parts of the device.) In addition to advantageous location of the clock signal input pins for this purpose, the PLD also typically has clock signal distribution circuitry extending from each of these pins throughout the device in a way that helps to minimize skew.

There is increasing interest in adding high-speed serial interface ("HSSI") circuitry to PLDs. HSSI circuitry typically employs various clock signals. It may therefore be desirable to provide ways to interface HSSI clock signal circuitry and other clock signal circuitry on a PLD.

SUMMARY OF THE INVENTION

A programmable logic device in accordance with the invention includes PLD core circuitry having circuitry for distributing at least one clock signal within the PLD core. High-speed serial interface ("HSSI") circuitry is located adjacent a side of the PLD core circuitry and includes a plurality of conductors for distributing clock signals within the HSSI circuitry. Selection circuitry can select at least one signal from the plurality of conductors for application to the circuitry for distributing a clock signal within the PLD core.

Various aspects of the circuitry are preferably arranged to minimize skew in the distribution of the clock signal or signals.

Further features of the invention, its nature and various advantages, will be more apparent from the accompanying drawings and the following detailed description.

DETAILED DESCRIPTION

Figure 1:
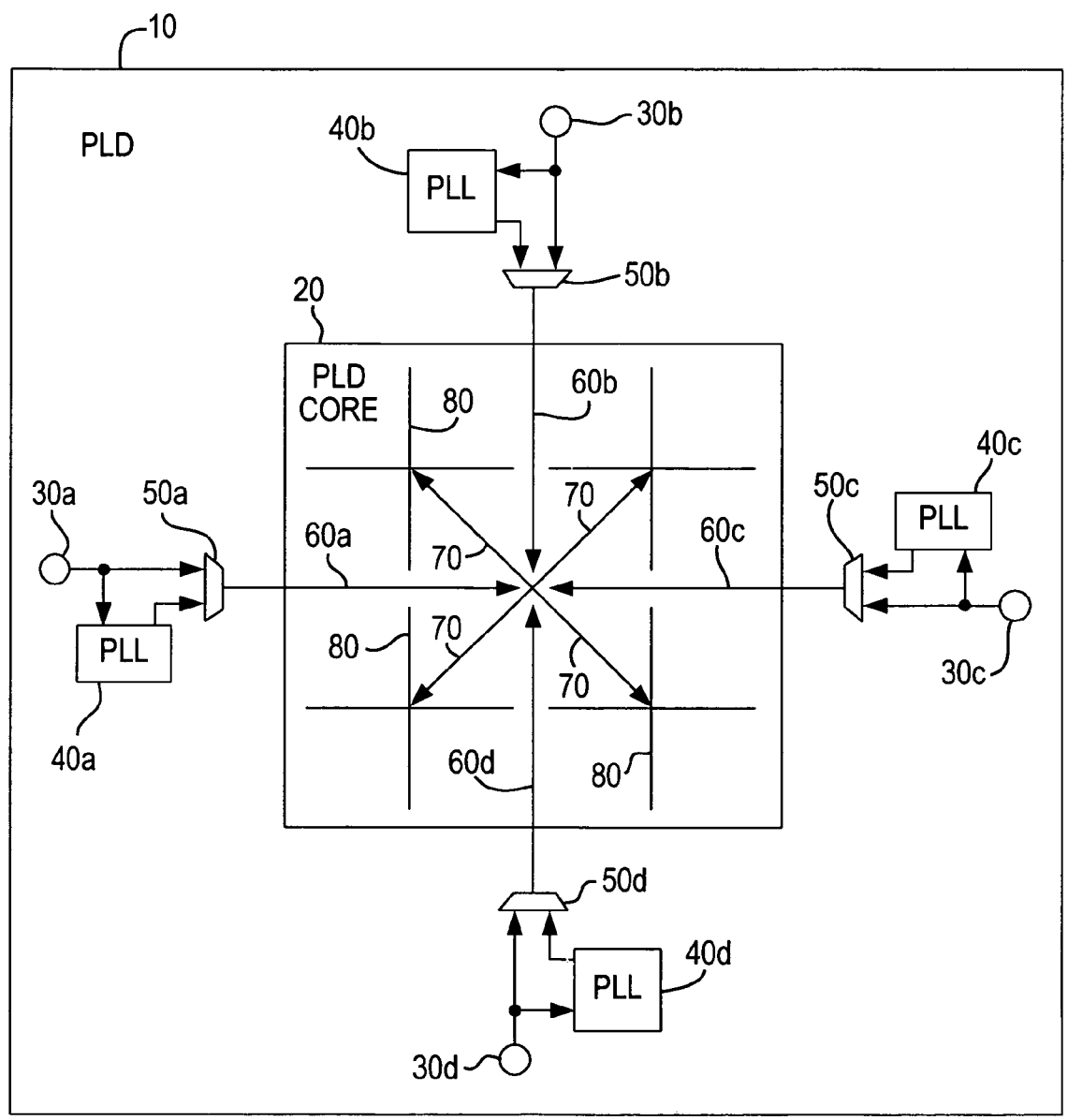
FIG. 1 is a simplified schematic block diagram of known PLD circuitry.

An illustrative, known, PLD organization is shown in FIG. 1. As shown in this FIG., PLD 10 includes core circuitry 20 surrounded by some peripheral circuitry (only the portions of interest here being shown). In particular, near the center of each side of PLD 10 (or core 20), the PLD has a respective clock signal input pin 30a, 30b, 30c, or 30d. The clock signal applied to each pin 30 is applied to one input terminal of an associated multiplexer 50a, b, c, or d, and to associated phase locked loop ("PLL") circuitry 40a, b, c, or d. The output signal of each PLL circuit 40 is applied to the other input terminal of the associated multiplexer 50. Each multiplexer 50 is controllable (e.g., programmably controllable) to select either one of its two input signals as its output signal.

The output signal of each multiplexer 50 is conveyed to the approximate center of core circuitry 20 via the associated lead 60a, b, c, or d. From the center of core 20, one or more of the clock signals fed in via leads 60 is distributed to any or all parts of core circuitry 20 via a typically highly symmetric network of clock distribution circuitry 70 and 80.

Such features as placing clock signal input pins near the center of each side of PLD 10 and using a highly symmetrical arrangement of circuitry 60, 70, and 80 for distributing clock signals throughout PLD core 20 help to reduce skew in the clock distribution circuitry.

It will be understood that FIG. 1 has been greatly simplified. For example, there may be more than one instance of one or more of circuit elements 30, 40, and 50 along each side of device 10. As another example, circuit elements 60, 70, and 80 may be provided in any desired numbers and may include multiplexers (for selectable routing) and buffers (for signal strengthening). Those skilled in the art will appreciate that PLL circuits 40 can be used for any of a number of purposes such as (1) upgrading the quality of the clock signal applied to the associated input pin 30, and/or (2) modifying the associated input clock signal in one or more respects (e.g., changing it in phase and/or frequency). Like the signals from pins 30, however, the signals from PLLs 40 are clock or clock-type signals and are generally referred to as clock signals herein to avoid unnecessarily complicating the discussion.

Figure 2:
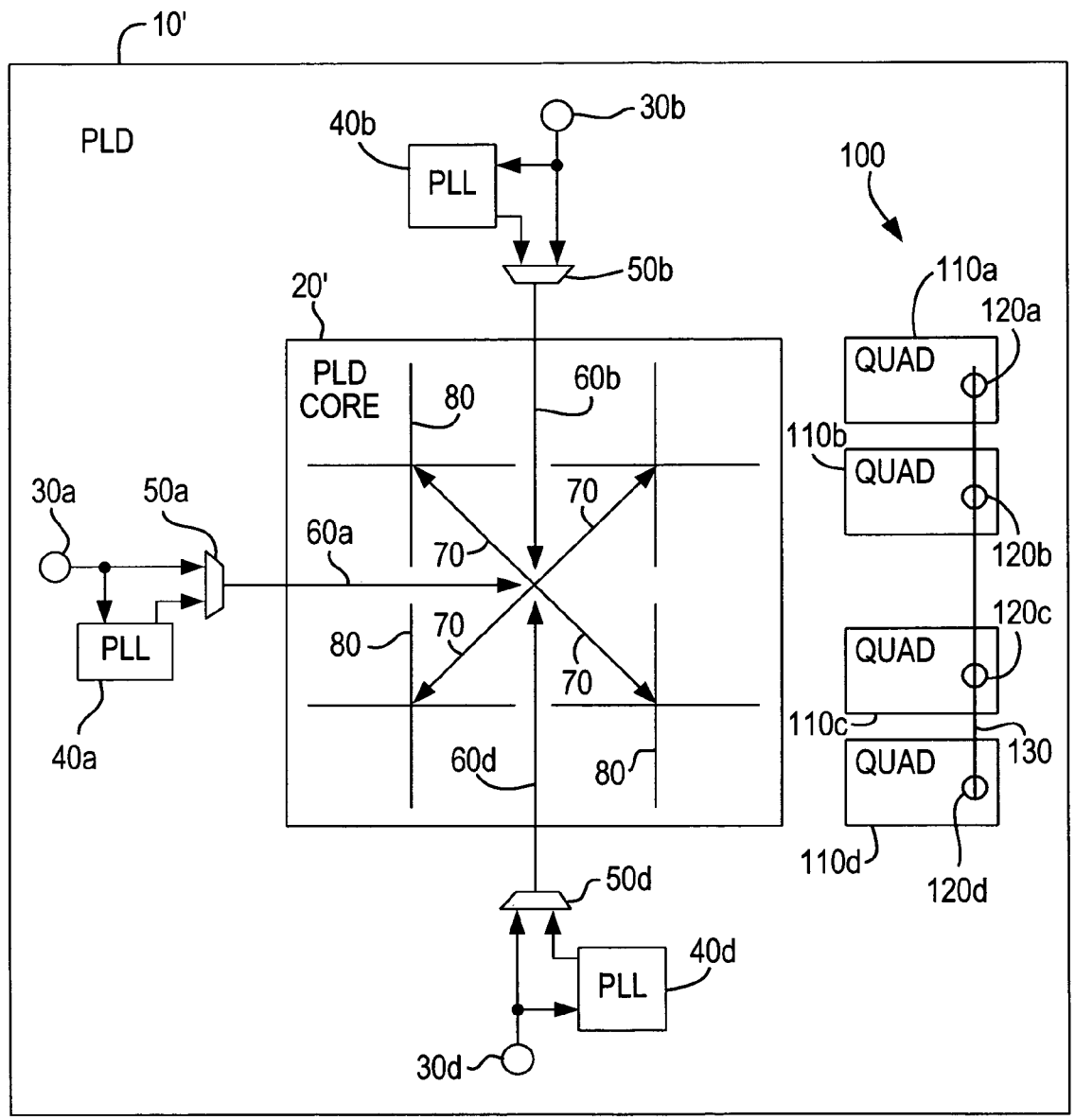
FIG. 2 is a simplified schematic block diagram of an illustrative embodiment of PLD circuitry with high-speed serial interface ("HSSI") circuitry added.

FIG. 2 shows an example of how PLD 10 may be modified to include some high-speed serial interface ("HSSI") circuitry. The modified PLD 10' shown in FIG. 2 is basically like PLD 10 (FIG. 1), except that circuit elements 30c, 40c, 50c, and 60c on the right side are omitted from PLD 10', and HSSI circuitry 100 is added in that same general area.

Circuitry 100 includes four "quads" of HSSI circuitry 110a-110d. Although not shown in detail in FIG. 2, each quad 110 includes four channels of HSSI circuitry. Each channel includes a high-speed serial data signal receiver sub-channel and a high-speed serial data signal transmitter sub-channel. Each receiver sub-channel may include clock and data recovery ("CDR") circuitry for recovering clock and data signals from an incoming serial data signal in which clock information is embedded. Each quad 110 may include PLL circuitry operating (in part) on a reference signal applied to a reference clock signal input pin 120 associated with that quad 110 or a similar signal applied to another of depicted input pins 120. A network of conductors 130 is provided for conveying clock signals among quads 110. The signals on the various conductors in network 130 may include signals from one or more of input pins 120 and/or signals from one or more of the above-mentioned in-quad PLLs.

The signals on network 130 are typically high-speed, low-jitter clock signals. As mentioned, they may be high-quality reference clock signals more or less directly from input pins 120, and/or they may be signals that have been conditioned by the high-speed PLLs in the HSSI circuitry. As such, these signals are potentially useful, not only in HSSI circuitry 100, but also in PLD core 20'.

Figure 3:
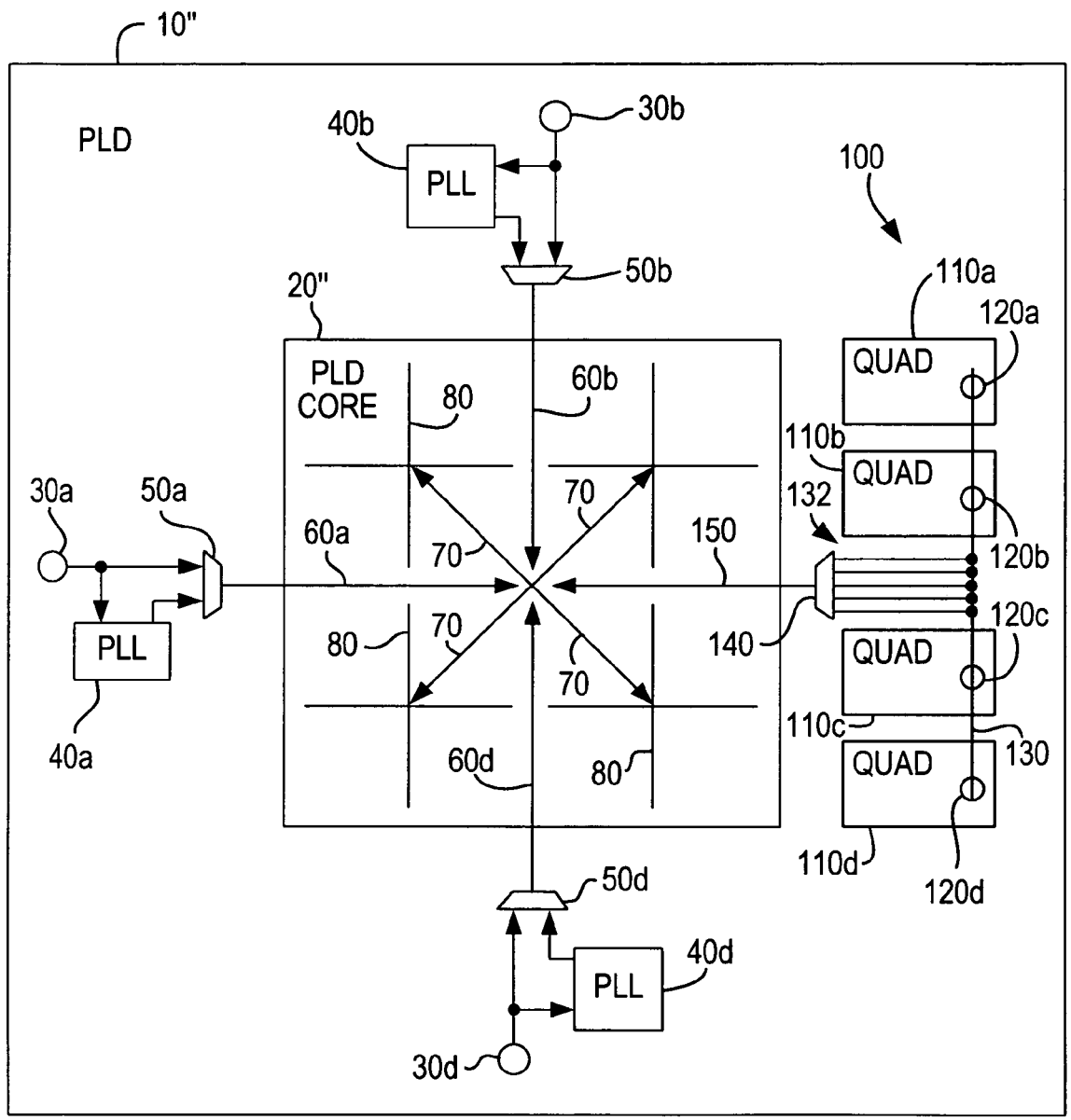
FIG. 3 is a simplified schematic block diagram showing an illustrative embodiment of additions to what is shown in FIG. 2 in accordance with the invention.

FIG. 3 shows an illustrative embodiment of circuitry in accordance with the invention for making clock signals from HSSI circuitry 100 available to the core of the PLD. PLD 10" in FIG. 3 is similar to PLD 10' in FIG. 2, with the addition of circuit components 132, 140, and 150. Some or all of the conductors in inter-quad clock network 130 are tapped via leads 132 to inputs of multiplexer 140. This multiplexer is controllable (e.g., programmably controllable) to select the signal on any one of its input leads 132 for application to its output lead 150. Note that (like each of multiplexers 50 in FIGS. 1-3) multiplexer 140 is preferably located near the center of the side of PLD 10" (or core 20") including HSSI circuitry 100. Note also that HSSI circuitry 100 is preferably approximately centered along its side of PLD 10" (or core 20"), and that leads 132 preferably tap network 130 near the center of that network and therefore near the center of the associated side of PLD 10" (or core 20"). All of this symmetry may be helpful in reducing skew in the clock signals from HSSI circuitry 100 that are introduced into PLD core 20" as is now being described.

The output lead 150 of multiplexer 140 extends to the approximate center of PLD core 20" (like each of conductors 60 in FIGS. 1-3). From this central location the signal on lead 150 can enter the earlier-described low-skew clock distribution network 70/80 that extends to substantially all portions of PLD core 20". In this way a clock signal from HSSI circuitry 100 can be distributed throughout PLD core 20" in the same way that clock signals from circuit groups 30/40/50a, 30/40/50b, and 30/40/50d can be distributed throughout the PLD core.

Although in the preceding paragraphs reference is made to, for example, the midpoint of the side of PLD 10", it may be more important for this point of approximate symmetry to be the midpoint of the side of PLD core 20". In FIG. 3 there is no significant difference between these points because PLD core 20" is approximately centered within PLD 10". But if PLD core 20" is not thus centered, then it may be more important for circuitry 100/110/120/130/132/140 to be approximately symmetrical about a midpoint of a side of PLD core 20".

As in the case of the earlier FIGS., it will be understood that FIG. 3 is considerably simplified. For example, the numbers of the various circuit elements shown in FIG. 3 are only illustrative, and these numbers can be more or less than in the FIG. 3 embodiment. As another illustration of this point, there can be more or less than the number of quads 110 shown in FIG. 3. There can be any number of conductors in network 130. There can be more or less than the number of reference clock inputs 120 shown in FIG. 3. There can be more than one instance of circuit elements 132, 140, and 150. If there is more than one of elements 140 and 150, then the signals 132 available to each may be the same, partly the same and partly different, wholly different, or any other desired arrangement. Instead of being located only along one side of PLD 10" as shown in FIG. 3, there may be one or more additional instances of HSSI circuitry 100 along one or more other sides of the PLD.

Figure 4:
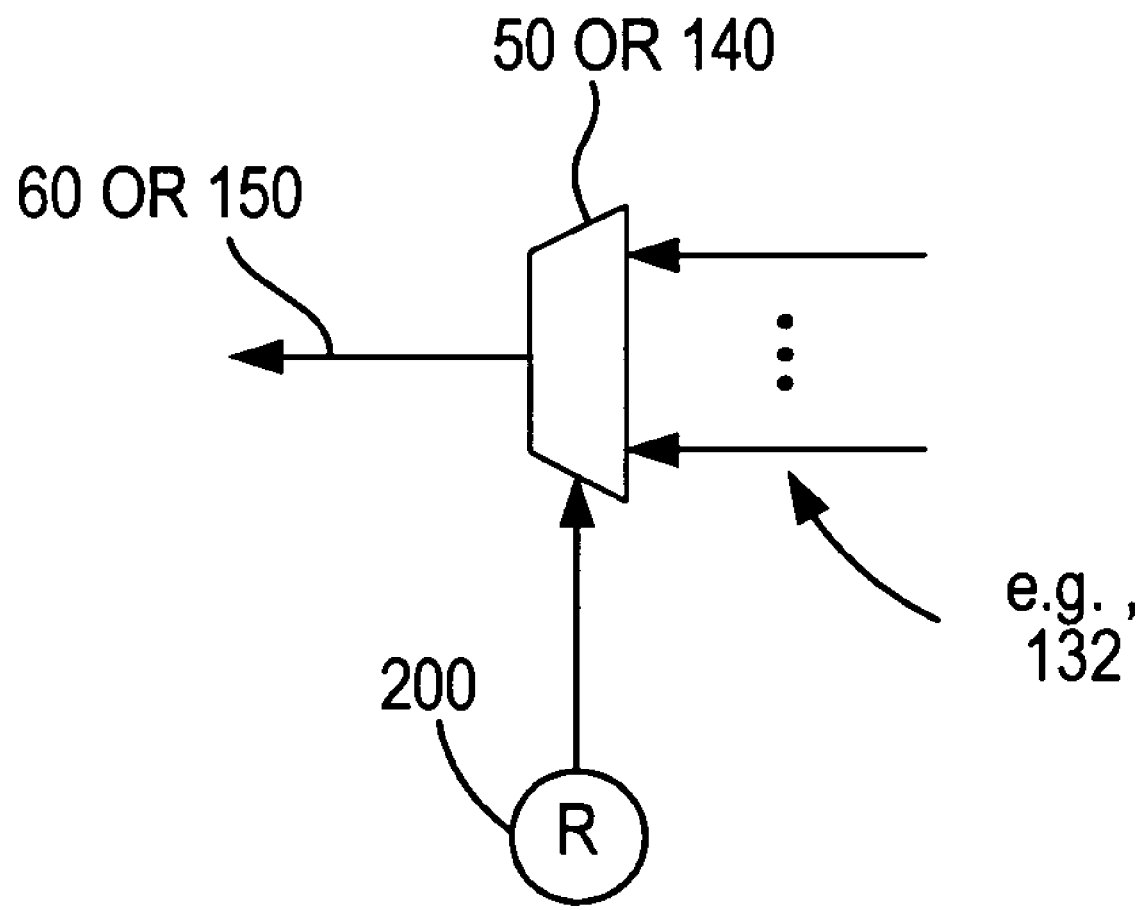
FIG. 4 is a simplified schematic block diagram showing an illustrative embodiment of control for certain elements in FIG. 3 in accordance with the invention.

An illustrative way to control the selection made by circuitry like 50 or 140 is programmably, e.g., as shown in FIG. 4. In the illustrative embodiment shown in FIG. 4, one or more memory elements (e.g., RAM cell(s)) 200 is or are programmed to control which of the primary inputs (e.g., 132) to a multiplexer 50 or 140 that multiplexer will select to be its output signal 60 or 150.

Figure 5:
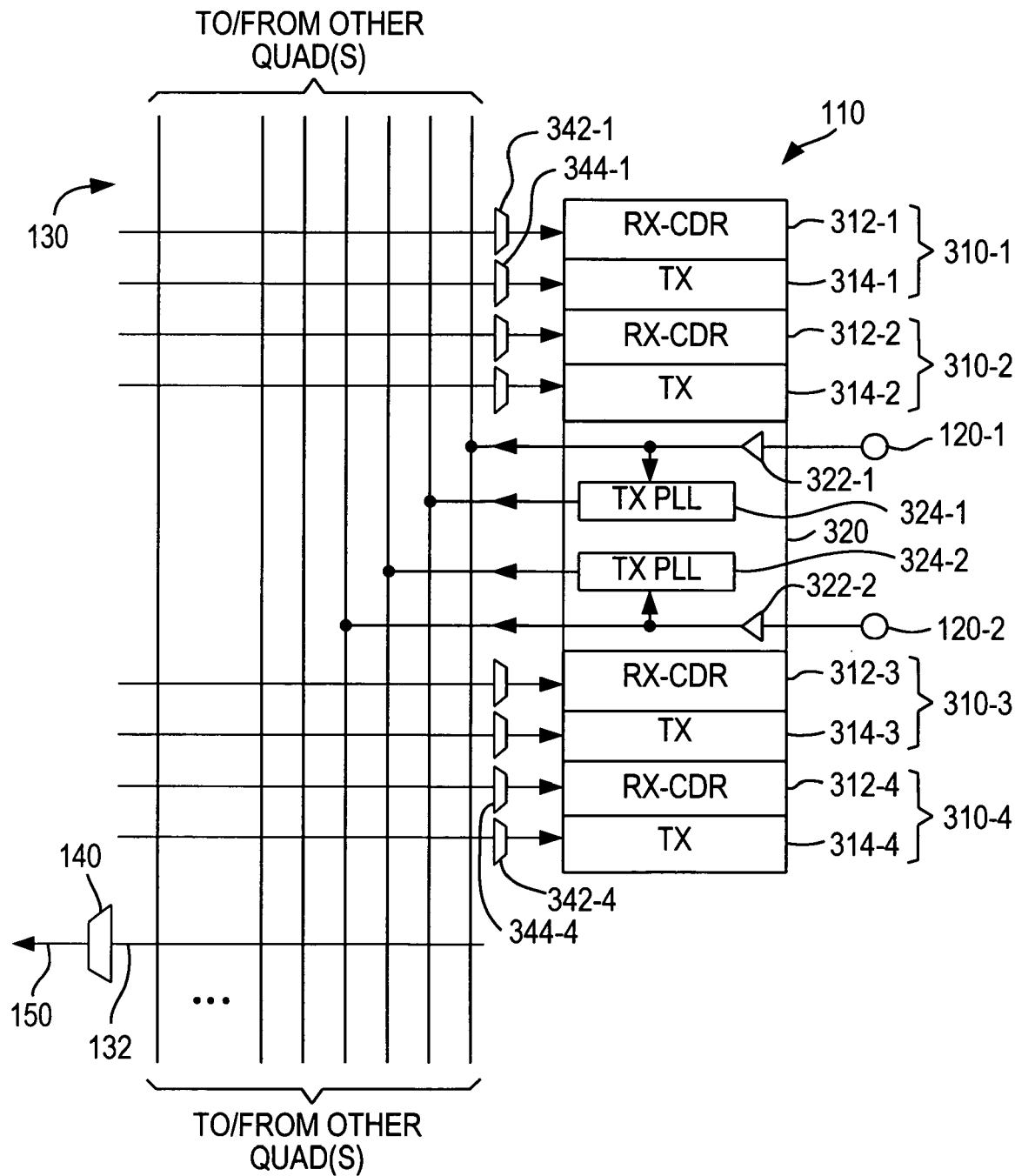
FIG. 5 is a simplified schematic block diagram showing an illustrative embodiment of a representative portion of FIG. 3 in more detail in accordance with the invention.

An illustrative embodiment of a representative portion of the FIG. 3 circuitry is shown in more detail in FIG. 5. FIG. 5 shows one representative HSSI quad 110. Consistent with the earlier discussion, quad 110 includes four HSSI transceiver channels 310-1 through 310-4. Each HSSI transceiver channel 310 includes a respective one of receiver/CDR subchannels 312-1 through 312-4 and a respective one of transmitter subchannels 314-1 through 314-4. Quad 110 also includes clock multiplier unit ("CMU") circuitry 320. Two reference clock signal input pins 120-1 and 120-2 are associated with quad 110 via CMU circuitry 320. In particular, CMU circuitry 320 includes a respective input buffer 322 for the reference clock signal from each of pins 120. The output signal of each buffer 322 is applied to a respective one of conductors 130. The output signal of each buffer 322 is also applied to a respective one of so-called TXPLLs 324. TXPLLs 324 are instances of what are described elsewhere in this specification as high-speed PLLs. An output signal of each of TXPLLs 324 is applied to a respective one of conductors 130. Again, these PLL output signals are among the signals generally referred to herein as clock signals.

Various clock signals on leads 130 can be selected for application to the various subchannels 312 and 314 of quad 110 by multiplexers 342-1 through 342-4 and 344-1 through 344-4. Although shown in simplified form in FIG. 5, each of multiplexers 342 and 344 typically has several inputs from at least several of conductors 130, and each of these multiplexers is programmably controlled (analogous to what is shown in FIG. 4) to select any one of its input signals as its output signal. Assuming that there is more than one quad (e.g., as shown in FIG. 3), at least some of conductors 130 make clock signals from depicted quad 110 available to such other quad(s), and others of conductors 130 make similar clock signals from such other quad(s) available to depicted quad 110.

Finally, FIG. 5 again shows circuit elements 132, 140, and 150 for applying a selectable one of the clock signals on various ones of conductors 130 to PLD core 20" as in FIG. 3 and as described in detail above.

Within PLD core 20/20'/20" the clock distribution circuitry 70/80 is preferably arranged (as has been said) to reduce skew in the clock signals being distributed. For example, a preferred arrangement of such circuitry may be described as being substantially symmetrical about a center point of PLD core 20/20'/20". Again, such symmetry helps to reduce skew.

PLL circuitry in HSSI circuitry 100 may be characterized as high-speed PLL circuitry. Other PLL circuitry 40 on the device may be characterized as low-speed PLL circuitry. These references to high and low speed are primarily relative to one another.

It will be understood that the foregoing is only illustrative of the principles of the invention, and that various modifications can be made by those skilled in the art without departing from the scope and spirit of the invention. For example, the numbers of instances of various circuit elements shown in the FIGS. herein are only illustrative, and other numbers of instances may be used instead if desired.

The invention claimed is:

1. Clock circuitry for a programmable logic device comprising:

a plurality of channels of high-speed serial interface circuitry including reference clock input circuitry and phase locked loop circuitry;

PLD core circuitry including circuitry for distributing at least one clock signal throughout the PLD core circuitry;
selection circuitry for selecting at least one of a signal from the reference clock input circuitry and an output signal of the phase locked loop circuitry for application to the circuitry for distributing; and
circuitry for sharing the signal from the reference clock input circuitry with at least a subplurality of the channels and for sharing the signal from the phase locked loop circuitry with at least a subplurality of the channels, wherein the selection circuitry is connected to the circuitry for sharing, wherein the circuitry for sharing extends approximately parallel and adjacent to a side of the programmable logic device, and wherein the selection circuitry is connected to the circuitry for sharing adjacent an approximate midpoint of that side of the programmable logic device.

2. The circuitry defined in claim 1 wherein the channels are located approximately symmetrically about the midpoint.

3. The circuitry defined in claim 1 further comprising:
programmable circuitry for controlling the selection made by the selection circuitry.

4. The circuitry defined in claim 1 wherein at least one of the channels includes clock and data recovery circuitry.

5. The circuitry defined in claim 1 further comprising:
clock signal input circuitry; and
circuitry for connecting the clock signal input circuitry to the circuitry for distributing.

6. The circuitry defined in claim 5 wherein the clock signal input circuitry is located at approximately a midpoint of a side of the programmable logic device.

7. The circuitry defined in claim 5 further comprising:
low-speed phase locked loop circuitry connected to the clock signal input circuitry; and
further selection circuitry for selecting either a signal from the clock signal input circuitry or an output signal of the low-speed phase locked loop circuitry for application to the circuitry for connecting.

8. The circuitry defined in claim 1 wherein the circuitry for distributing is substantially symmetrical about a central point of the PLD core circuitry.

9. A programmable logic device comprising:
PLD core circuitry including circuitry for distributing at least one clock signal within the PLD core circuitry;
high-speed serial interface circuitry adjacent a side of the PLD core circuitry and including a plurality of conductors for distributing clock signals within the high-speed serial interface circuitry; and
selection circuitry for selecting at least one signal from the plurality of conductors for application to the circuitry for distributing, wherein the high-speed serial interface circuitry is disposed substantially symmetrically about the midpoint of the side of the PLD core circuitry.

10. The device defined in claim 9 wherein the selection circuitry is disposed adjacent the midpoint.

11. The device defined in claim 10
wherein the circuitry for distributing is disposed substantially symmetrically about a center point of the PLD core circuitry.

12. The device defined in claim 9
wherein the clock signals distributed by the conductors include a high-speed serial interface circuitry reference clock signal.

13. The device defined in claim 12
wherein the clock signals distributed by the conductors additionally include an output signal of phase locked loop circuitry in the high-speed serial interface circuitry.

14. The device defined in claim 9
wherein the high-speed serial interface circuitry includes clock and data recovery circuitry.

15. The device defined in claim 9 further comprising:
programmable circuitry for controlling the selection made by the selection circuitry.

16. The device defined in claim 9
wherein the high-speed serial interface circuitry includes data receiver circuitry and data transmitter circuitry.

17. A programmable logic device comprising:
a plurality of channels of high-speed serial transceiver circuitry;
PLD core circuitry including circuitry for distributing a plurality of clock signals with the PLD core circuitry;
a plurality of conductors for distributing clock signals among the channels of high-speed serial transceiver circuitry; and
selection circuitry for selecting at least one signal from the plurality of conductors for application to the circuitry for distributing at approximately a midpoint of a side of the PLD core circuitry.

* * * * *